United States Patent [19]

Itoh

[11] Patent Number: 5,220,530
[45] Date of Patent: Jun. 15, 1993

[54] SEMICONDUCTOR MEMORY ELEMENT AND METHOD OF FABRICATING THE SAME

[75] Inventor: Masahiro Itoh, Tokyo, Japan

[73] Assignee: OKI Electric Industry Co., Ltd., Tokyo, Japan

[21] Appl. No.: 738,543

[22] Filed: Jul. 31, 1991

[30] Foreign Application Priority Data

Aug. 7, 1990 [JP] Japan .................................. 2-207673

[51] Int. Cl.⁵ .............................................. G11C 7/00
[52] U.S. Cl. .................... 365/189.01; 365/149
[58] Field of Search ................... 365/189.01, 149, 182; 357/23.6

[56] References Cited

U.S. PATENT DOCUMENTS 4,970,689  11/1990  Kenney ............................... 365/149
5,136,533   8/1992  Harari ................................. 365/149
5,148,393   9/1992  Furuyama ......................... 365/149

Primary Examiner—Eugene R. LaRoche
Assistant Examiner—A. Zarabian
Attorney, Agent, or Firm—Wenderoth, Lind & Ponack

[57] ABSTRACT

In a gain-cell type semiconductor memory element having a first MOSFET and a second MOSFET, the sources of the first and second MOSFETs are connected to a bit line, the drain of the first MOSFET and the gate of the second MOSFET are connected to each other to serve as a charge storage region, the gate of the first MOSFET is connected to a write word line, the drain of the second MOSFET is connected to a power supply line, and the channel region of the second MOSFET is capacitively coupled via an insulating layer with a read word line thereby to receive substrate biasing by capacitive coupling from the read word line.

5 Claims, 18 Drawing Sheets

"H" WRITING   "H" HOLDING   "H" READING

"L" WRITING   "L" HOLDING   "L" READING

SEMICONDUCTOR MEMORY ELEMENT AND METHOD OF FABRICATING THE SAME

FIELD OF THE INVENTION

The present invention relates to a semiconductor memory element, and in particular to a gain cell having an amplifying function.

BACKGROUND OF THE INVENTION

Memory cells of the stacked capacitor type are often employed in DRAMs (dynamic random access memories). But the memory cells of the stacked capacitor type do not have amplifying function, and with the reduction in the cell area, the signal charge quantity is decreased, and the signal voltage is lowered. As a solution thereto, gain cells which themselves have an amplifying function are employed. An example of such gain cells is described in (a) Nikkei Electronics (Oct. 7, 1985), pp. 262 to 266, and (b) H. Shichijo et al. "TITE RAM: A NEW SOI DRAM Gain Cell for Mbit DRAM's", Ext. Abs. 16th. Conf. on Solid State Devices & Materials, Kobe, 1984, pp. 265 to 268.

FIG. 1 and FIG. 2 show the structure and the circuit configuration of the gain cell described in these prior-art publications.

As illustrated, it comprises a polysilicon MOSFET (SOI MOSFET) 34 formed on an oxide film 32 and serving as a write transistor (switching transistor) and a bulk MOSFET 33 serving as a read transistor (sense transistor). The MOSFET 33 is formed to intersect the channel of the MOSFET 34. Since both transistors are of n-channel construction, the polycrystalline channel part may be either p-doped, non-doped or lightly n-doped. The gain cell is associated with write word lines (electrodes) 36 and 39, a read bit line 37, and a write bit line 40. A charge storage layer 35 is formed between the word line 36 and the read transistor 33.

For writing, the word lines 36 and 39 are made High, and the write bit line 40 is made to carry either "1" or "0". After the writing, the transistor 39 is kept off, and the charge storage layer 35 is electrically floating.

For reading, only the read word line 36 is made High, and the gate electrode potential of the read transistor 33 rises because of the capacitive coupling, and the potential on the read bit line 37 is either "1" or "0" depending on the data that has been stored on the charge storage layer 35.

Structure of the gain cell may be viewed as a combination of an EPROM element and a polysilicon transistor connected to the floating gate of the EPROM element.

The prior art memory device had a shortcoming in that each cell had to be connected to five interconnection conductors. This imposed a limitation to the increase in the degree of integration. Moreover, in reading operation, the ratio between capacitances is critical but since the capacitance depends on the area of the capacitor electrodes, this could not be highly accurate, and stable operation was not ensured.

SUMMARY OF THE INVENTION

An object of the invention is to enable increase in the degree of integration of a memory device.

Another object of the invention is to reduce the number of interconnection conductors to which a gain cell must be connected.

A further object of the invention is to reduce the effect of the variation in the area of the capacitor electrode.

According one aspect of the invention, there is provided a semiconductor memory element having a circuit configuration comprising:
  a bit line used for reading and writing;
  a write word line;
  a read word line;
  a power supply line;
  a first MOSFET having a source electrode, a drain electrode and a gate electrode;
  a second MOSFET having a channel region, a source electrode, drain electrode and a gate electrode;
  said source electrode of said first MOSFET and said source electrode of said second MOSFET being connected to said bit line;
  said drain electrode of said first MOSFET and said gate electrode of said second MOSFET being connected to each other to serve as a charge storage region;
  said gate electrode of said first MOSFET being connected to said write word line;
  said drain electrode of said second MOSFET being connected to said power supply line; and
  said channel region of said second MOSFET being capacitively coupled via an insulating layer with said read word line thereby to receive substrate biasing by capacitive coupling from the read word line.

According another aspect of the invention, there is provided a semiconductor memory device comprising:
  a plurality of bit lines used for reading and writing;
  a plurality of write word lines;
  a plurality of read word lines;
  a power supply line;
  a matrix of a plurality of gain cells, each connected to one of said bit lines, one of said write word lines, one of said read word lines and said power supply line;
  each gain cell comprising:
    a first MOSFET having a source electrode, a drain electrode and a gate electrode;
    a second MOSFET having a channel region, a source electrode, drain electrode and a gate electrode;
    said source electrode of said first MOSFET and said source electrode of said second MOSFET being connected to said one of the bit lines;
    said drain electrode of said first MOSFET and said gate electrode of said second MOSFET being connected to each other to serve as a charge storage region;
    said gate electrode of said first MOSFET being connected to said one of said write word lines;
    said drain electrode of said second MOSFET being connected to said power supply line; and
    said channel region of said second MOSFET being capacitively coupled via an insulating layer with said one of the read word lines, thereby to receive substrate biasing from said one of the read word lines;
  an access means for writing data in or reading data from a selected gain cell, and comprising:
    a write drive means for applying a first potential to the write word line to which the selected gain cell is connected
    a data applying means for applying, when said write drive means is applying said first potential, data potential depending on the data to be written, to the bit line to which the selected gain cell is connected, so that the potential on said charge storage region is either a first value or a second value depending on the data potential applied;

a read drive means for applying a first potential to the read word line to which the selected gain cell is connected, so that the potential on said bit line is either a first value or a second value depending on the potential on said charge stored region.

According another aspect of the invention, there is provided a semiconductor memory element having a structure comprising:

a substrate;

a first insulating layer on said substrate;

a low-resistance layer separated from said substrate by said first insulating layer;

a second insulating layer on said low-resistance layer;

a first semiconductor layer having a channel region and low-resistance diffusion regions being separated from said low-resistance layer by said second insulating layer;

a thin insulating layer on said semiconductor layer;

a first polycrystalline semiconductor layer of low-resistance separated from said first semiconductor layer by said thin insulating layer;

a thick insulating layer on said low-resistance polycrystalline semiconductor layer;

a second polycrystalline semiconductor layer having a low-resistance diffusion regions being separated from said first polycrystalline semiconductor layer by said thick insulating layer, said diffusion regions being in contact with said first polycrystalline layer;

a second thin insulating layer on said second polycrystalline semiconductor layer; and a third polycrystalline semiconductor layer of low-resistance being separated from said second polycrystalline semiconductor layer by said second thin insulating layer;

said diffusion regions of said second polycrystalline semiconductor layer constituting source and drain regions of a first MOSFET and said third polycrystalline semiconductor layer constituting a gate electrode of said first MOSFET;

said diffusion regions constituting source and drain regions of a second MOSFET and said first polycrystalline semiconductor layer constituting a gate electrode of said second MOSFET;

said gate electrode of said first MOSFET also serving as part of a write word line;

said source electrode of said first MOSFET being connected a bit line for reading and writing;

said drain electrode of said second MOSFET being connected to a power supply line; and said low-resistance layer also serving as part of a read word line, thereby to give substrate biasing to the channel region by capacitive coupling via the second insulating layer.

According a further aspect of the invention, there is provided a method of fabricating a semiconductor memory element comprising the steps of:

(a) providing a semiconductor substrate having a first insulating layer thereon and a first semiconductor layer on said first insulating film;

(b) forming a first trench in said first semiconductor layer and said first insulating film so that said first trench reaches said substrate;

(c) forming a second insulating film in said first trench;

(d) filling the first trench with a first polycrystalline silicon layer of low-resistance;

(e) forming a second trench in part of said first semiconductor layer so that said second trench reaches said first insulating film;

(f) removing the first insulating film by means of the second trench, thereby leaving a cavity at the space where the second insulating film has been present;

(g) forming a first oxide film on the downwardly-facing surface of the semiconductor layer and on the upwardly-facing surface of the substrate;

(h) filling a second polycrystalline silicon layer in said cavity and said second trench;

(i) forming a thin $SiO_2$ layer on part of the first semiconductor layer;

(j) forming a third polycrystalline silicon layer of low-resistance on said thin $SiO_2$ layer on the first semiconductor layer;

(k) forming first and second low-resistance semiconductor regions in part of said first semiconductor layer which is not covered by said third polycrystalline silicon layer;

(l) forming a third insulating film extending throughout the entire surface of the substrate over said first, second and third polycrystalline silicon layers;

(m) forming a first contact hole extending through said third insulating film and reaching part of said third polycrystalline silicon layer;

(n) forming a second contact hole extending through said third insulating film and reaching part of said first low-resistance region of the first semiconductor layer;

(o) forming a low-resistance polycrystalline semiconductor layer over said third polycrystalline silicon layer and over said first low-resistance region in said first semiconductor layer;

(p) forming a second thin $SiO_2$ film on part of said polycrystalline semiconductor layer;

(q) forming a fourth polycrystalline silicon layer of low-resistance over part of said polycrystalline semiconductor layer, with said second thin $SiO_2$ layer interposed between them; and (r) forming first and second low-resistance regions in part of the polycrystalline semiconductor layer which is not covered by said fourth polycrystalline silicon layer.

According to the invention, the bit line is shared for writing and reading, and the wiring conductor is formed in the element separation region. The degree of integration or the packing density of the memory elements can be increased significantly.

Moreover, the storage transistor is controlled by the substrate biasing effect via the insulator film, so the margin in the fabrication of the device can be enlarged.

DETAILED DESCRIPTION OF THE PREFERRED EMBODIMENTS

Figure 1:
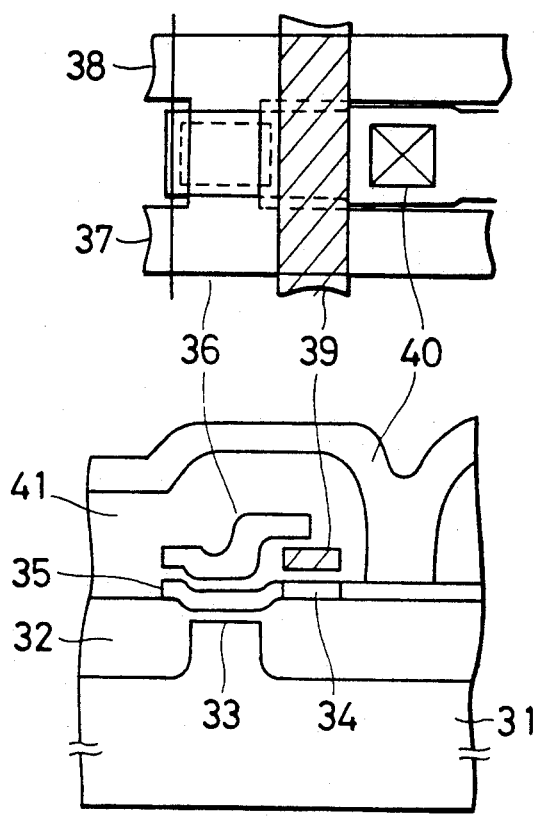
FIG. 1 shows a structure of a prior art gain cell.
Figure 2:
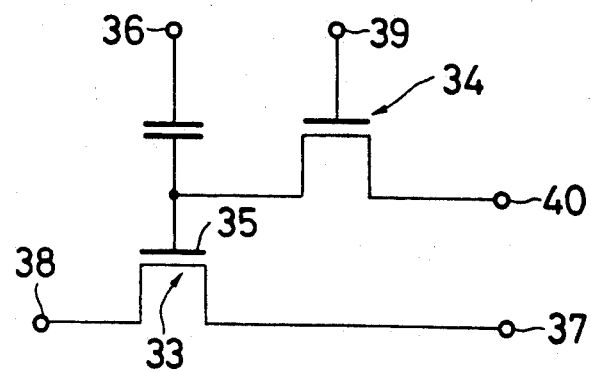
FIG. 2 is a circuit diagram showing the prior art gain cell.
Figure 3:
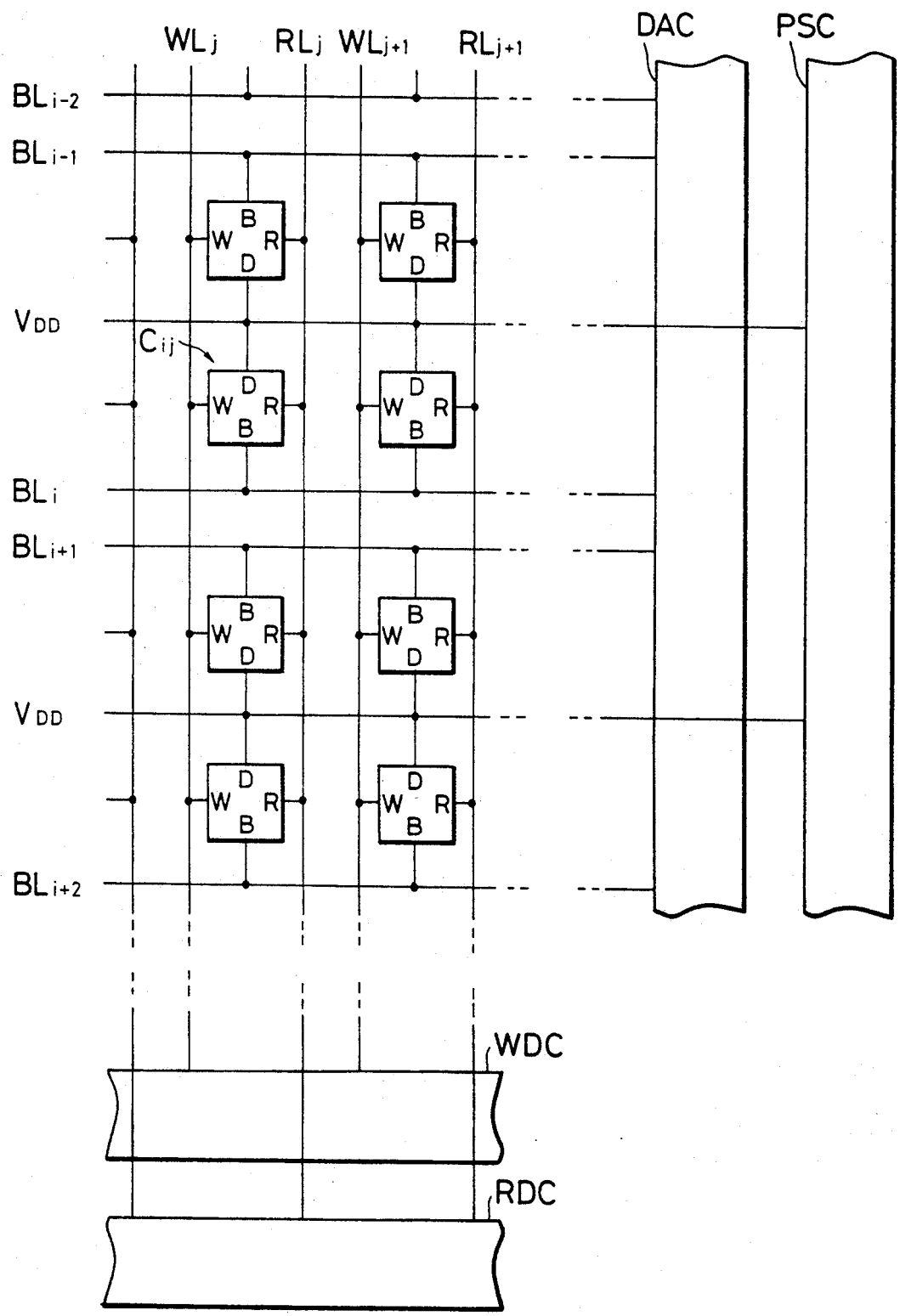
FIG. 3 is a circuit diagram showing a matrix of gain cells of an embodiment of the invention.
Figure 4:
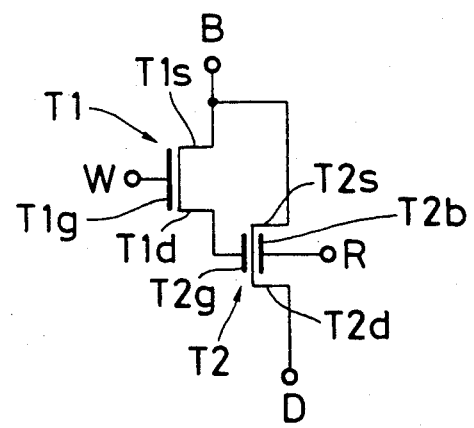
FIG. 4 is a circuit diagram showing the gain cell in FIG. 3.

FIG. 3 shows the circuit of part of a memory device comprising a plurality of gain cells of an embodiment of the invention. In FIG. 3, four rows by two columns of gain cells are illustrated. All the gain cells have identical have identical configuration as shown in FIG. 4.

Since all the gain cells are similarly configured, the following description which is made on one of the gain cells, Cij, connected to one of bit lines, BLi, one of write word lines, WLj, and one of read word lines, RLj, is applicable to other gain cells as well.

The gain cell Cij comprises a write transistor T1 in the form of an SOI (silicon on insulator) MOSFET (metal oxide silicon field effect transistor) formed of polysilicon. This switching transistor is sometimes referred to as a first transistor in this specification. The gain cell further comprises a data storage transistor T2 which is also in the form of an SOI MOSFET. This data storage transistor is sometimes referred to as a second transistor in this specification.

The gate T1g of the write transistor T1 is connected to a write word line WLj. The source T1s of the write transistor T1 is connected to a bit line BLi, and the drain T1d of the write transistor T1 and a gate T2g of the storage transistor T2 are connected to each other to serve as a charge storage region. The drain T2d of the storage transistor T2 is connected to the power supply line $V_{DD}$, and the source T2s of the storage transistor T2 is connected to the bit line BLi. A substrate biasing electrode T2b of the storage transistor T2 is connected to a read word line RLj. As will be apparent from the subsequent description, the substrate biasing of the storage transistor is given from the read word line RLj by capacitive coupling via an insulating layer.

Reference marks BL, WL and RL are also used to denote the bit lines, the write word lines and the read word lines, collectively, or an arbitrary one of them.

The bit lines BL, the write word lines WL, the read word lines RL are connected respectively to a data applying circuit DAC, a write drive circuit WDC and a read drive circuit RDC, which in combination form an access means for writing data in or reading data from a selected gain cell.

The write drive circuit WDC applies a first potential (5 V) to the write word line (WL) to which the selected gain cell is connected. The data applying circuit DAC applies, when the write drive circuit WDC is applying the first potential, data potential (5 V or 0 V) depending on the data to be written, to the bit line (BL) to which the selected gain cell is connected, so that the potential on the charge storage region is either a first value (2.5 V) or a second value (0 V) depending on the data potential applied. The read drive circuit RDC applies a first potential (5 V) to the read word line (RL) to which the selected gain cell is connected, so that the potential on said bit line is either a first value (5 V) or a second value (0 V) depending on the potential on said charge stored region.

The write drive circuit WDC applies a second potential (0 V) to other write word lines (WL) when it applies the first potential to the write word line (WL) to which the selected gain cell is connected. The read drive circuit RDC applies a second potential (0 V) to other read word lines (RL) when it applies the first potential to the read word line (RL) to which the selected gain cell is connected. A power supply circuit PSC is connected to the power supply lines $V_{DD}$ to maintain the power supplying line $V_{DD}$ at a first potential (5 V).

The operation of the gain cell will now be described in sequence with reference to FIG. 5A to FIG. 5F.

The voltages applied to the respective terminals are assumed to be as follows:

$V_{DD} = Va$ $V_{WL} = 0$ or $Va$ $V_{BL} = 0$ or $Va$ $V_{RL} = 0$ or $Vb$

The threshold voltage Vt1 of the write transistor T1 can be any value satisfying:

$0 < Vt1 < Va$.

The threshold voltage Vt2 of the storage transistor T2 must satisfy the following relationships. This is because the voltage required to turn on the storage transistor T2 changes by Vb' depending on the voltage Vb applied to the substrate biasing electrode T2b from the read word line RL, and this is given by:

$Vt2 - Vb'$

| | |
|---|---|
| During "High" writing: <br> $Va - Vt1 < Vt2$ off | (a) |
| During "High" reading: <br> $Vt2 - Vb' < Va - Vt1$ ON | (b) |
| During "Low" writing: <br> $0 < Vt2$ off | (c) |
| During "Low" reading: <br> $0 < Vt2 - Vb'$. | (d) |

It follows that:

$0 < Vt2 - Vb' < Va - Vt1 < Vt2$

If $Vt1 = 2.5$ V and $Va = 5$ V, then, $0 < Vt2 - Vb' < 2.5 < Vt2$

Figure 6:
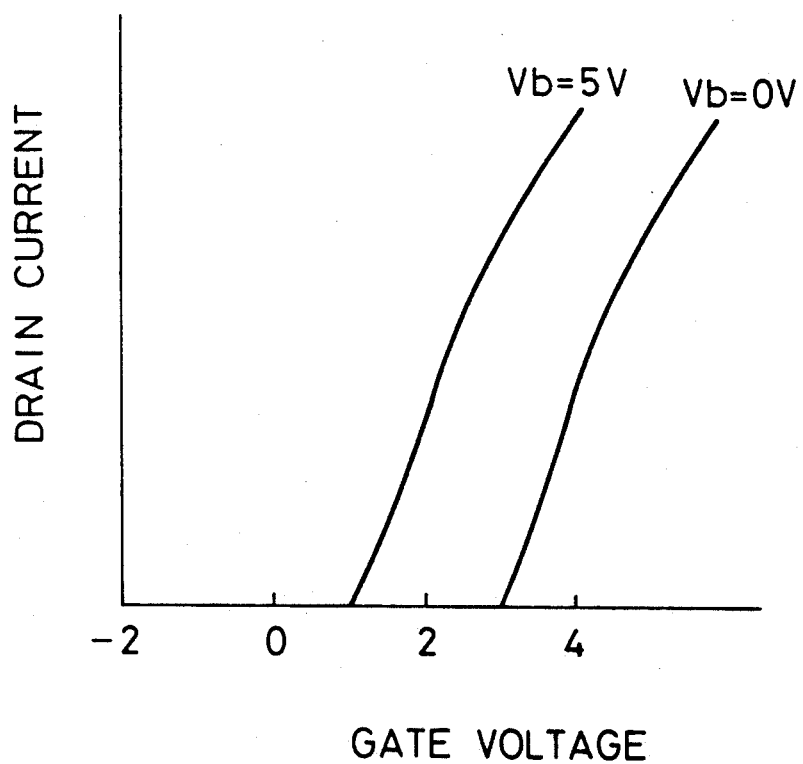
FIG. 6 is a diagram showing the relationship between the gate voltage and the drain current of the storage transistor T2 in FIG. 3.

It is therefore considered appropriate that the threshold voltage of the storage transistor T2 is 3 V or more. The variation Vb' in Vt2 due to Vb depends on the thickness of the semiconductor layer forming the channel of the storage transistor T2 (e.g., the semiconductor layer 3 in the structure of FIG. 10A to FIG. 10D, later described), the thickness of the insulating film separating the channel of the storage transistor T2 from the substrate (e.g., the insulating layer 6B in the structure of FIG. 10A to FIG. 10D, later described)), and the like, so it is here assumed that Vb'=2 V when Vb=5 V. That is, the relationship between the gate voltage and the drain current of the storage transistor T2 is as shown in FIG. 6.

The operation will now be described with reference to FIG. 5A to FIG. 5F, taking the above-described relationship as an example.

Figures 5A, 5B, 5C:
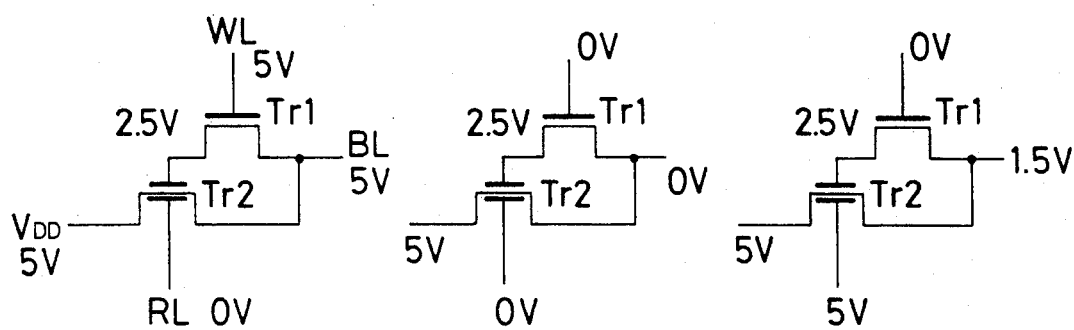
FIG. 5A to FIG. 5F are diagrams showing the operation of the gain cell in FIG. 3.
Figures 5D, 5E, 5F:
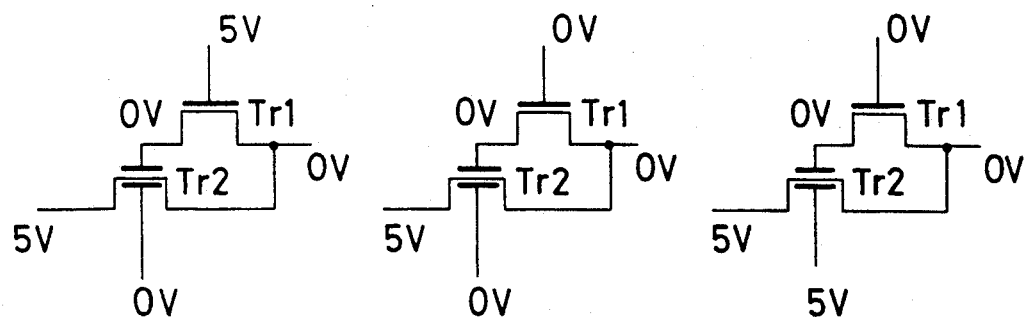

For writing, 5 V is applied to the write word line WL, as illustrated in FIG. 5A and FIG. 5D. For writing "H", 5 V is applied to the bit line B, as illustrated in FIG. 5A, so that the gate voltage of the storage transistor T2 rises to 2.5 V because of the relationship with the gate voltage 5 V of the write transistor T1 and the threshold voltage Vt1. For writing "L", 0 V is applied to the bit line BL, as illustrated in FIG. 5D, so that the gate voltage of the storage transistor T2 becomes 0 V. During writing, the read word line RL is at 0 V, so the storage transistor T2 is kept off.

For holding data, the write word line WL and the bit line BL are both set at 0 V, as illustrated in FIG. 5B and FIG. 5E. If "H" has been written, the gate voltage of the storage transistor T2 is held at 2.5 V. If "L" has been written, the gate voltage of the storage transistor T2 is held at 0 V.

For reading data, 5 V is applied to the read word line RL, as illustrated in FIG. 5C and FIG. 5F. The threshold voltage of the storage transistor T2 is 1 V. If "H" has been written, the storage transistor T2 is turned on by virtue of the 2.5 V at its gate, and the bit line BL therefore rises to 1.5 V, as illustrated in FIG. 5C. If "L" has been written, the storage transistor T2 is kept off, and the bit line BL is therefore at 0 V.

In the above description, only one cell has been considered. For accessing any specific cell in a cell array, one of the bit lines, one of the write word lines and one of the read word line to which the particular cell is connected, are selectively activated. For instance, for accessing the cell Cij in FIG. 3, the bit line BLi, the write word line WLj and the read word line RLj are selected.

Figure 7:
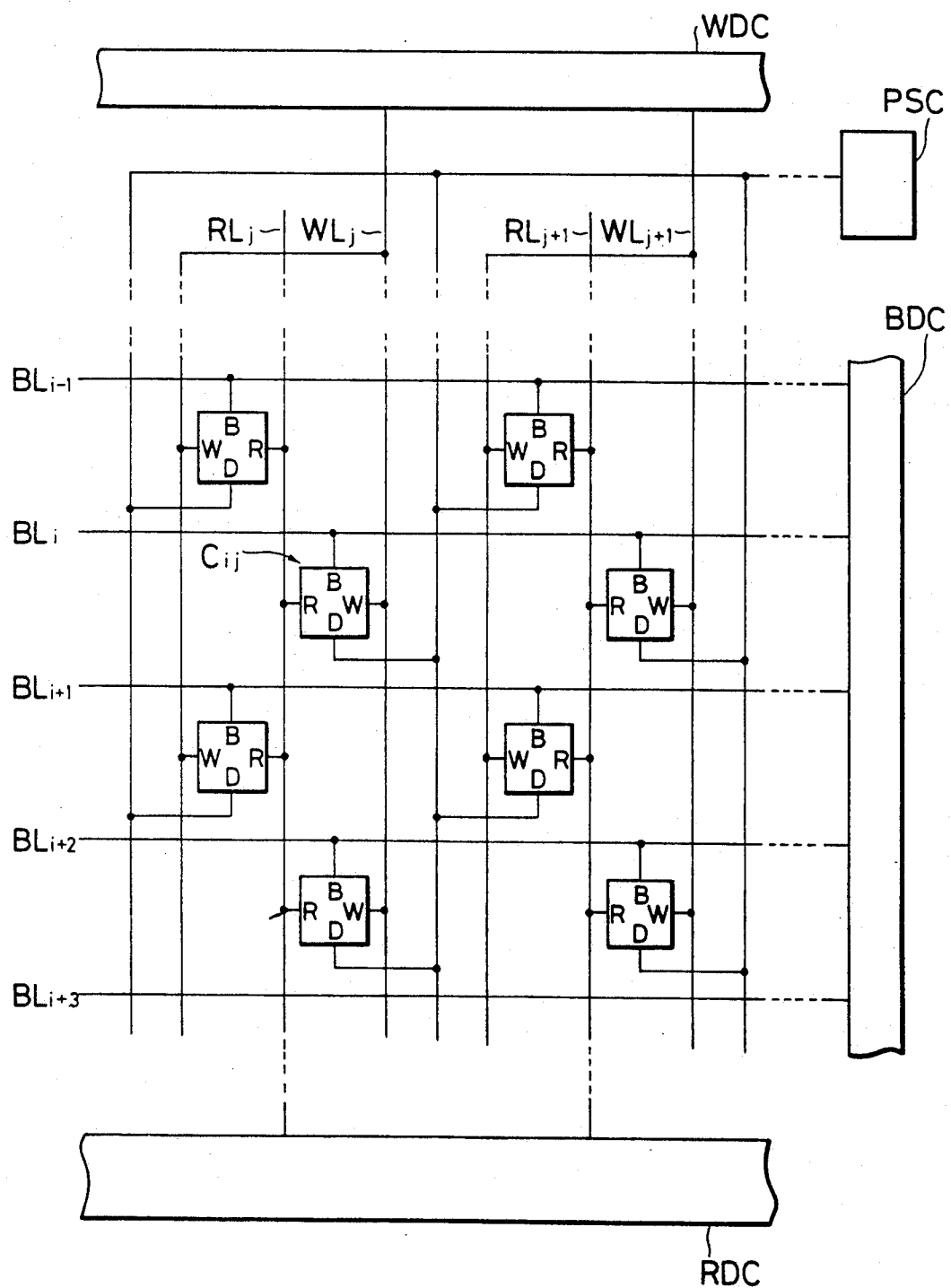
FIG. 7 is a circuit diagram showing another embodiment of the invention.
Figure 8:
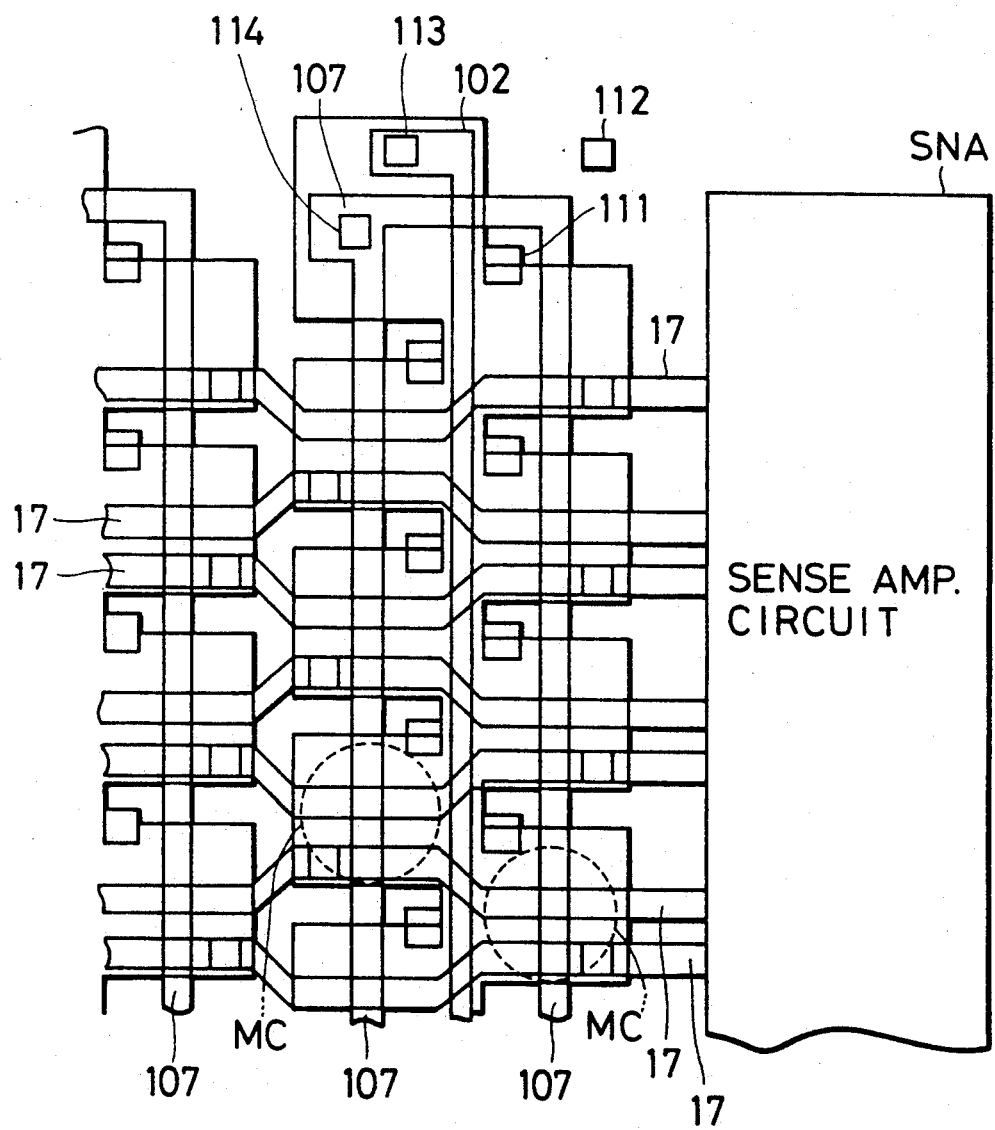
FIG. 8 is a schematic plan view of the matrix of gain cells shown in FIG. 7.
Figure 9:
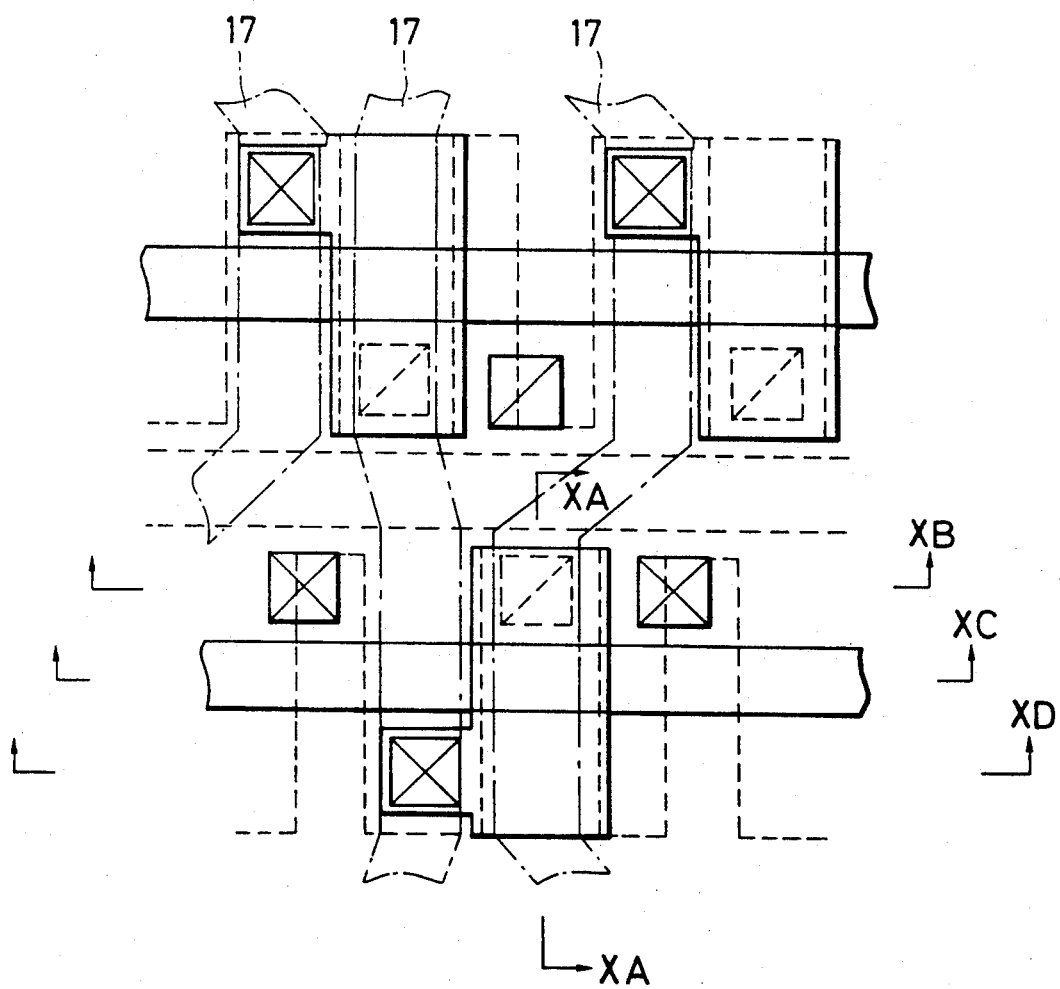
FIG. 9 is an enlarged view of part of the matrix of gain cells shown in FIG. 8.

FIG. 7 shows another example of a matrix of gain cells. The internal configuration of the gain cells is identical to that shown in FIG. 4. The difference from FIG. 3 is the arrangement of the bit lines, the write word lines, the read word lines and the power supply lines and the connection of the gain cells with these lines.

In this example, the bit lines BL are provided for each row of the cells MC, the write word lines WL are provided for each column of gain cells MC, the read word lines RL are provided for each pair of columns of gain cells adjacent to each other, and the $V_{DD}$ power supply lines are provided for the gain cells in each pair of columns which are adjacent to each other and which consist of the gain cells connected to different read word lines RL. The write word lines WL for each pair of columns adjacent to each other are connected to each other and are therefore given identical numbers.

The gain cells are provided at alternate intersections of the write word lines and the bit lines. The gain cells in rows adjacent to each other are connected to different word lines. Similarly, the gain cells in columns adjacent to each other are connected to different bit lines.

An example of layer structure of the gain cells in the matrix of FIG. 7 will now be described with reference to FIG. 8, FIG. 10A to FIG. 10D, and FIG. 11A to FIG. 11E.

As illustrated in these figures, a plurality of aluminum conductors 17 (in FIG. 8, only seven of them being illustrated) constituting the bit lines (BL) extend generally in a horizontal direction. The bit lines 17 are connected to a sense amplifier circuit SNA. A plurality of polysilicon conductors 107 (in FIG. 8, only three of them being illustrated) respectively constituting the write word lines WL extend in a vertical direction, and a plurality of polysilicon layers 7 constituting the read word lines RL (in FIG. 8, only one being illustrated) extend in the vertical direction.

The gain cells MC (schematically indicated by a circle of dotted line in FIG. 8) are formed at the intersections of the write word lines and the bit lines 17. The cells MC are thereby arranged in rows and columns to form a matrix.

As is better seen from FIG. 10A to FIG. 10D and FIG. 11A to FIG. 11E, formed on a silicon substrate 1 are a low-resistance polysilicon layers and a $V_{DD}$ power supply conductor layer 5 of polysilicon. The polysilicon layer 7 is separated from the substrate 1 by an insulating film 6A of $SiO_2$. The polysilicon layer 5 is separated from the substrate 1 by a an insulating layer 4 of $Si_3N_4$. The polysilicon layer 5 and the polysilicon layer 7 are separated from each other by an upright insulating layer 4B of $Si_3N_4$.

The polysilicon layer 7 is of a low resistance layer and serves both as the read word line RL and the substrate biasing electrode Tb for the storage transistor T2. As is best seen from FIG. 11A, the polysilicon layer 7 comprises a central strip-shaped portion 7a extending in the vertical direction and between two columns of the gain cells adjacent to each other, and projections 7b projecting laterally into the areas for the cells MC in the columns on the respective sides of the strip-shaped portion 7a. The projections 7b on the respective sides are staggered, i.e., shifted in the vertical direction so that the projections on the left side, for example, are positioned intermediate in the vertical direction between the projections of the right sides. The strip-shaped portion 7a has a ridge portion 7c extending in the vertical direction throughout the entire length of the strip-shaped portion 7a. As will be later described in detail, the projections 7b are covered with a silicon layer 3. The ridge portion 7c is not covered by the silicon layer and its top surface is at the same level as the silicon layer 3. The polysilicon layer 7 is connected via a read word line contact 113 to a lead not shown.

The polysilicon layer 5 is provided at the same height level as the polysilicon layer 7 and surrounding the polysilicon layer 7 serves as a $V_{DD}$ power supply line. As is best seen from FIG. 11A, the polysilicon layer 5 comprises a central strip-shaped portion 5a extending in the vertical direction and between the two columns of the cells adjacent to each other, and projections 5b disposed between adjacent projections 7b.

In the figures, reference numeral "5b (5)" means that the particular portion or member indicated is designated as "5b" but it is also part of the portion or member designated by "5". Similar explanation applies also to "7b (7)".

The polysilicon layer 5 is continuous throughout the matrix of the cells and connected to a lead via one or more contacts 112 (only one being illustrated) formed in the peripheral area where the cells are not formed.

The polysilicon layer 5 is connected, at its projections 5b, to the drains T2d of the storage transistors T2 via contact chips 111 (FIG. 8, FIG. 9, FIG. 10B and FIG. 11A to FIG. 11E) filling a contact hole extending through interlayer insulating films 11 and 16 and covering the parts of the polysilicon layer 5 and the drains T2ds neighboring each other. The contact chips 111 can be formed of the same material as the bit lines 17 and in the same process as the bit lines 17.

Figure 11A:
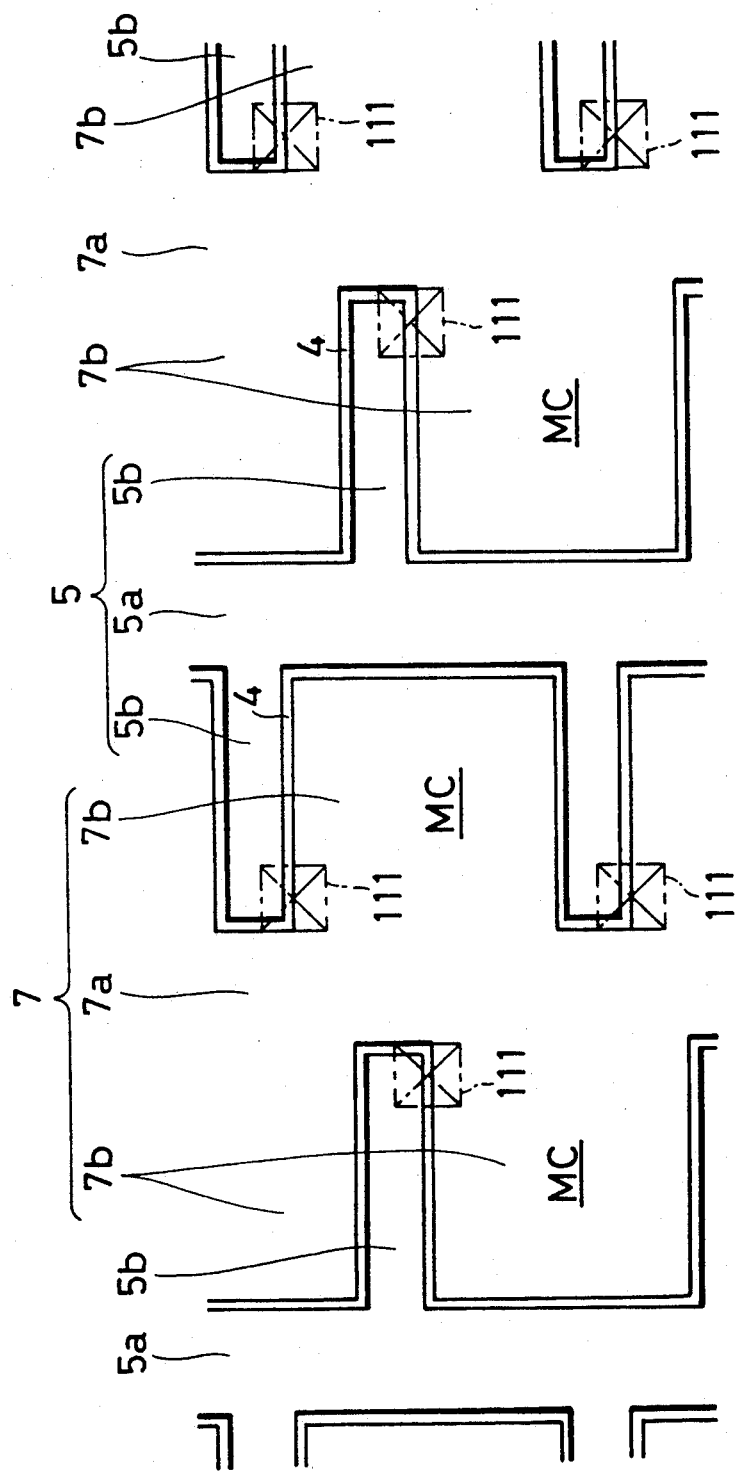
FIG. 11A to FIG. 11E are plan views at line XIA—XIA, line XIB—XIB, line XIC—XIC, line XID—XID and line XIE—XIE in FIG. 10A to FIG. 10D.
Figure 11B:
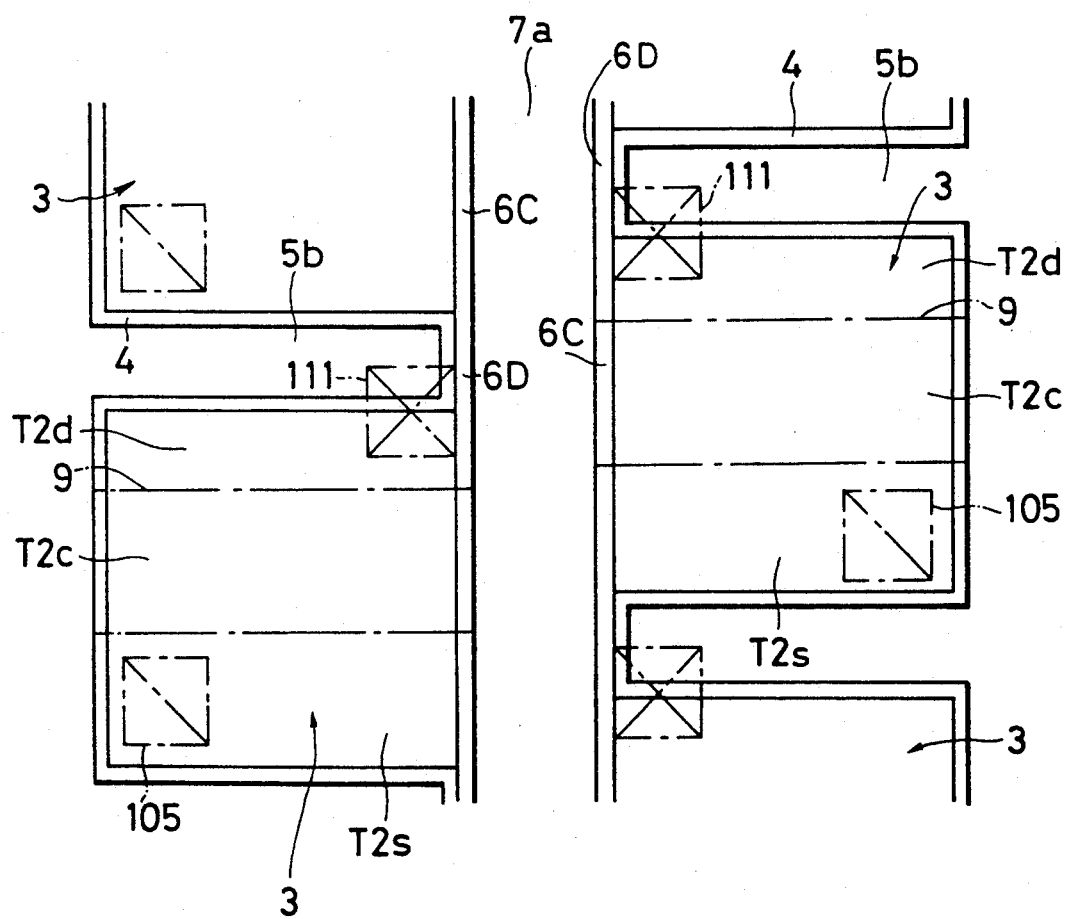

The silicon layers 3 are formed in the respective cell areas and are situated over the projections 7b, being separated from the projection 7b by an insulator layer 6B of $SiO_2$, which is a thermal oxide film. The silicon layers 3 are separated from the ridge portion 7c by an insulator layer 6C and 6D of $SiO_2$, which is also a thermal oxide film. The insulator layers 6B, 6C and 6D, as well as the insulator layer 6A are formed in the same process as will be described later. Each of the silicon layers 3 comprises a channel region T2c, a drain region (n+ diffusion region) T2d and a source region (n+ diffusion region) T2s of the storage transistor T2. The source region T2s and the drain region T2d of the storage transistor T2 are on the lower and the upper side of the channel region T2c, as seen in FIG. 11B.

The drain T2d is connected via the contact chip 111, as shown in FIG. 8, FIG. 9, FIG. 10B and FIG. 11A to FIG. 11E, to the $V_{DD}$ power supply layer 5, as described above.

Figure 10A:
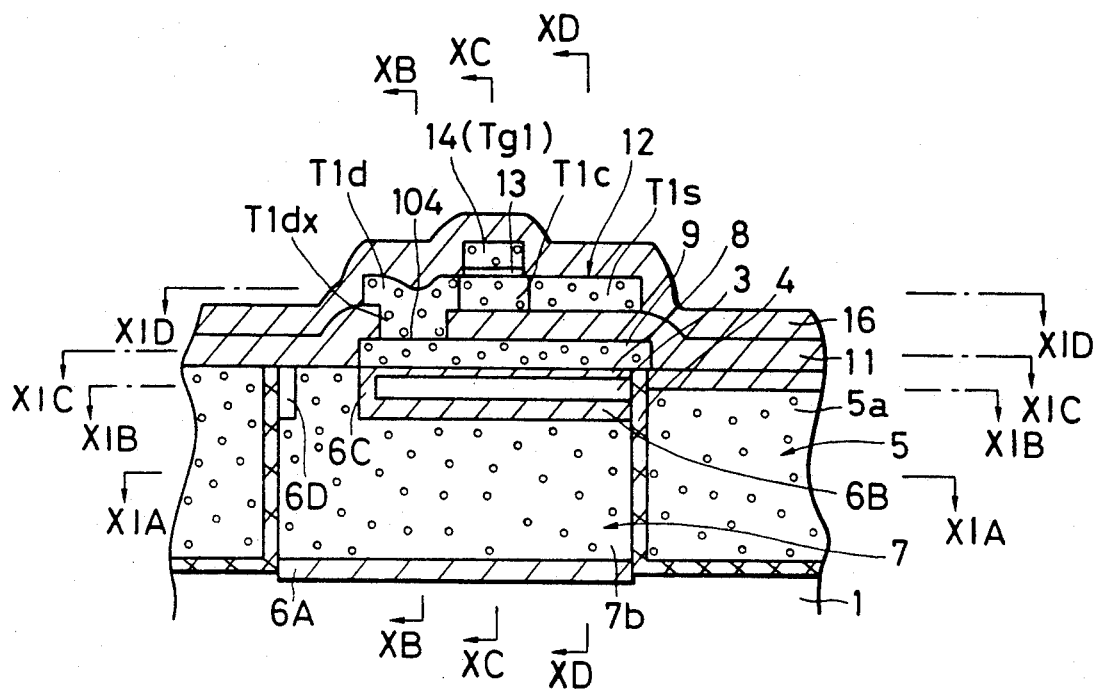
FIG. 10A to FIG. 10D are sectional views along line XA—XA, line XB—XB, line XC—XC and line XD—XD in FIG. 9.
Figure 11C:
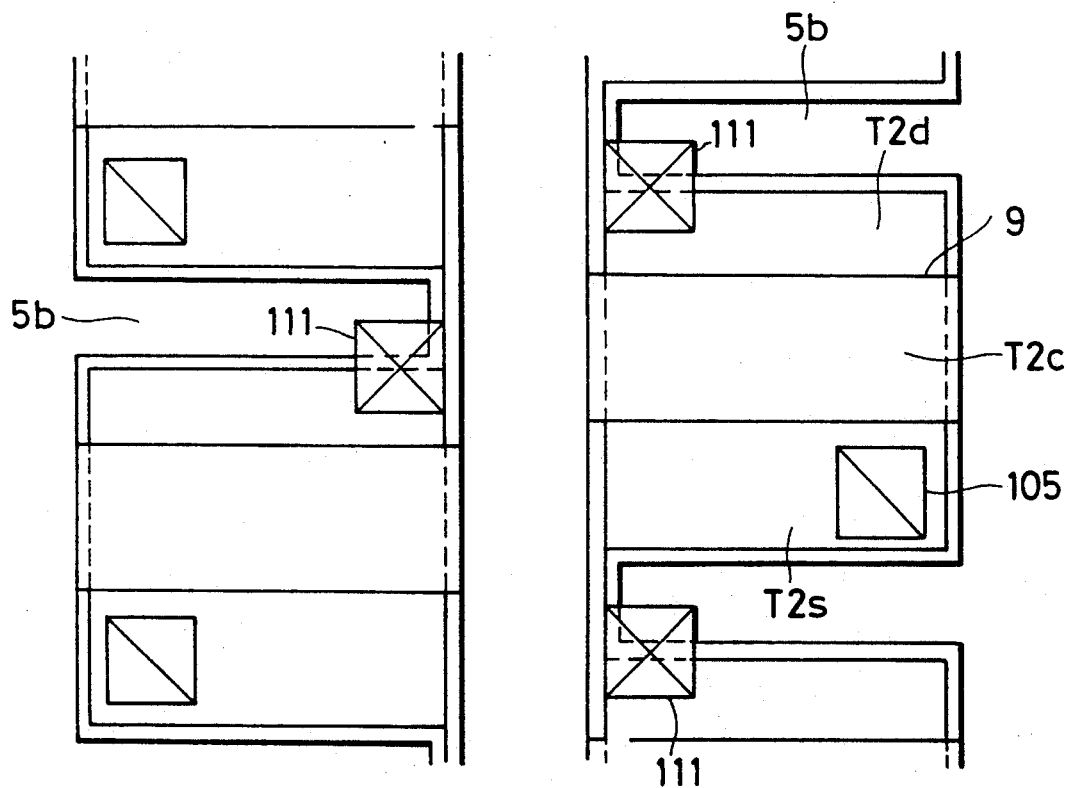

The gate T2g of the storage transistor T2 is formed over the channel region T2c being separated by a thin insulating layer 8 of $SiO_2$. The gate T2g is formed of a low-resistance polysilicon layer 9 which is disposed within the space over the projection 7b, is rectangular in shape, and one of its edges coincides with the outer edge of the projection 7b and the opposite edge of the polysilicon layer 9 coincides with the inner edge of the projection 7b where it is joined with the strip-shaped portion 7a, as shown in FIG. 10A, FIG. 11B and FIG. 11C.

The channel region T2c of the transistor T2 is sandwiched by the gate T2g and the substrate biasing electrode 7b, and the substrate biasing from the read word line 7 is effected by capacitive coupling across the insulating layer 6B.

Figure 11D:
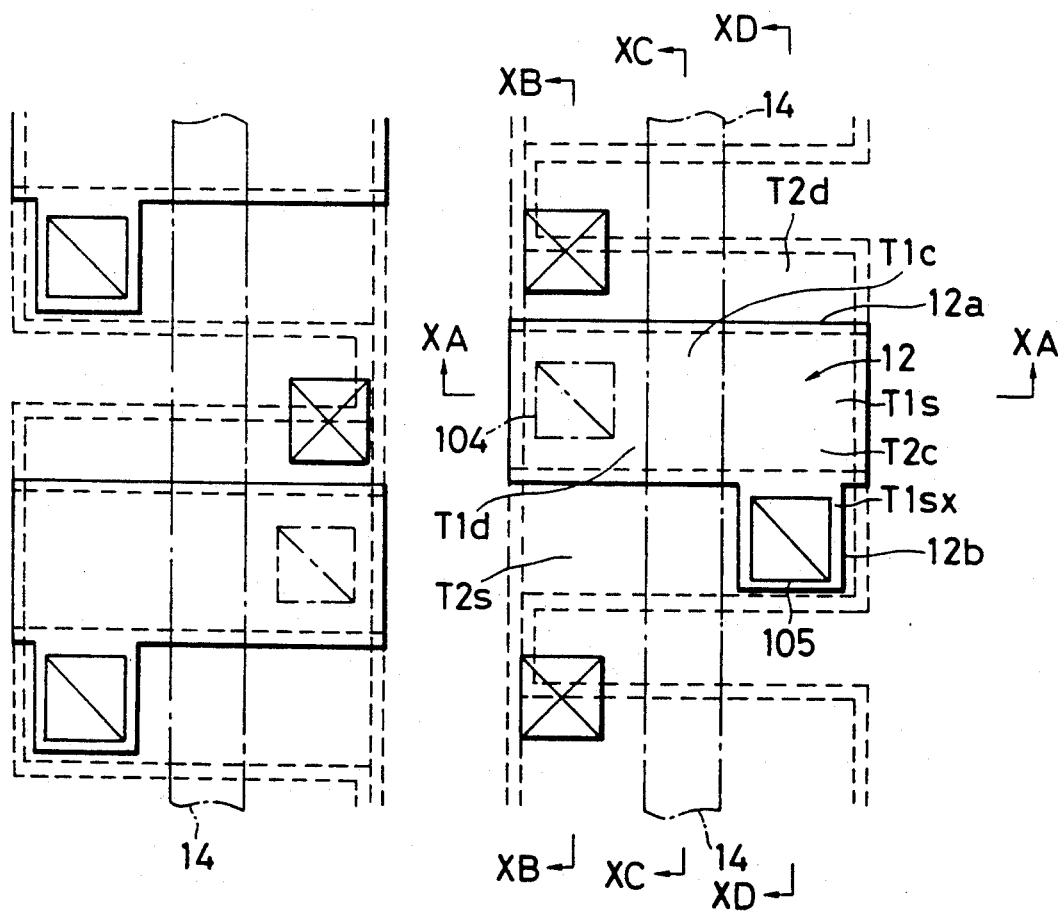

Another low-resistance polysilicon layer 12 is formed over the gate T2g, being separated by the first interlayer insulating film 11 which is relatively thick and extends throughout the entire area of the cell matrix. The polysilicon layer 12 is disposed within the space over the projection 7b and is generally hooked as shown in FIG. 11D. More specifically, it comprises a rectangular part 12a and a tab part 12b extending laterally (downward as seen in FIG. 11D) from an outer end of the rectangular part 12a. Formed in the rectangular part 12a are a channel region T1c a source region T1s (diffusion layer) and a drain region T1d (diffusion layer). Hanging from the drain region toward the substrate 1 is a drain contact region T1dx. Formed in the tab part 12b is a source contact region T1sx.

Figure 10B:
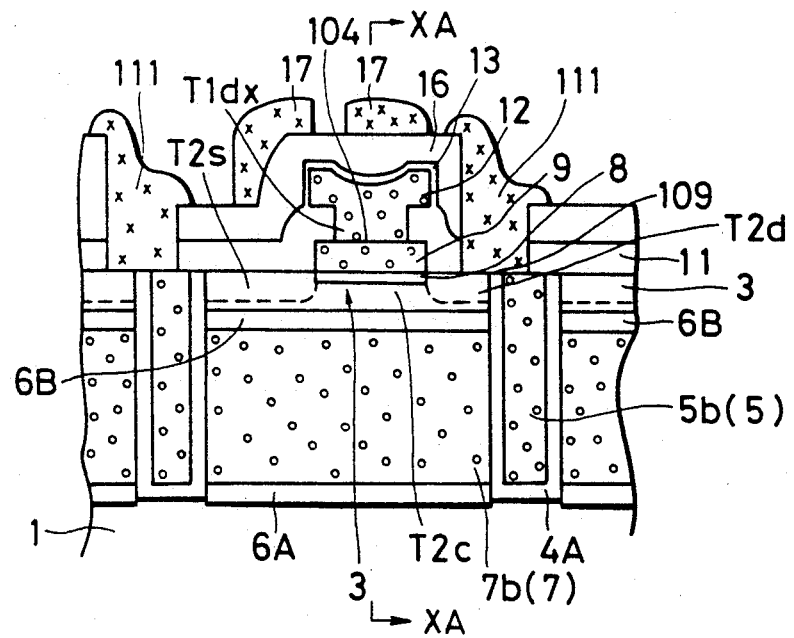
Figure 10:
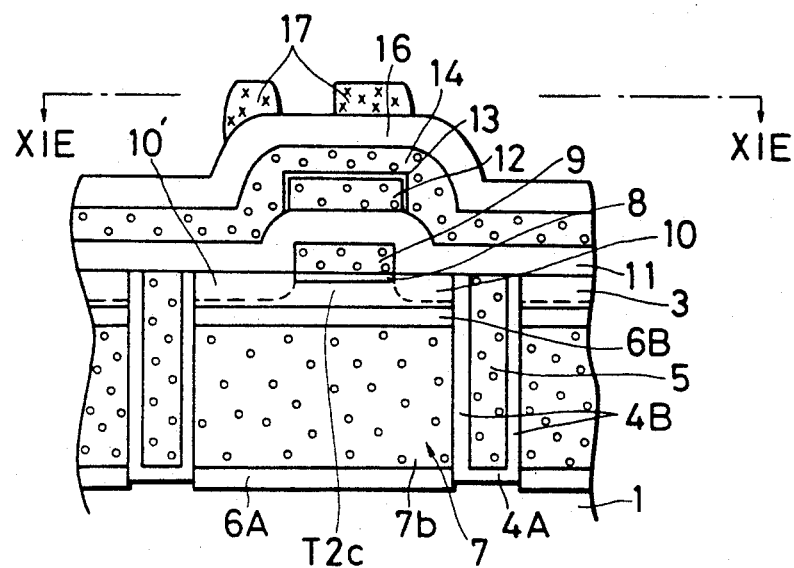
Figure 10:
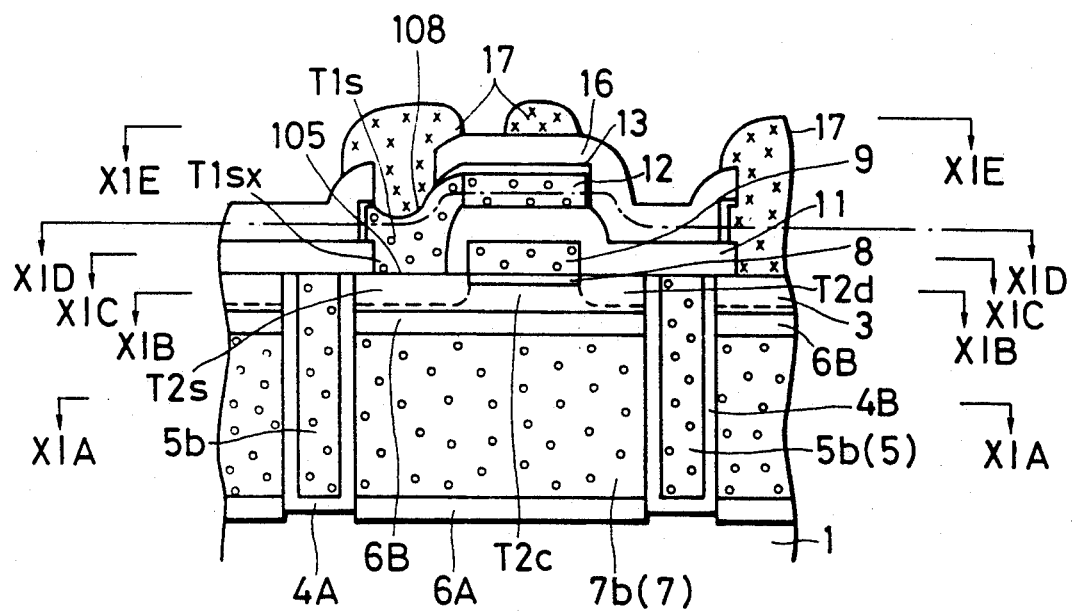

As shown in FIG. 11D, the source region T1s and the drain region T1d are on the right and left parts (as seen in FIG. 11D) of the channel region T1c. As shown in FIG. 10D, the source contact region T1sx is in contact, via a contact hole extending through the first interlayer insulating film 11, with the source region T2s of the storage transistor T2. The drain contact region T1dx extend downward as seen in FIG. 10B and is connected via contact 104 in a contact hole extending through the first interlayer insulating film 11, with the gate 9 (T2g) of the storage transistor T2.

The tab part 12b having the source contact region T1sx serves as a lead in the arrangement in which the source region T2s and the drain region T2d of the storage transistor T2 are on the lower and the upper side of the channel region T2c (as shown in FIG. 11B), while the source region T1s and the drain region T1d of the channel region T1c of the write transistor T1 are formed on the right and left sides of the channel region T1c (as shown in FIG. 11D).

The gate T1g is formed of part of a write word line 14 extending in the vertical direction as seen in FIG. 11D. The gate T1g is formed over the channel region T1c, being separated by a thin insulating layer 13 of $SiO_2$, as shown in FIG. 10A and FIG. 10C.

The write word lines 14, the polysilicon layer 12, and the first interlayer insulating film 11 are covered with the second interlayer insulating film 16 extending throughout the entire area of the matrix.

Figure 11E:
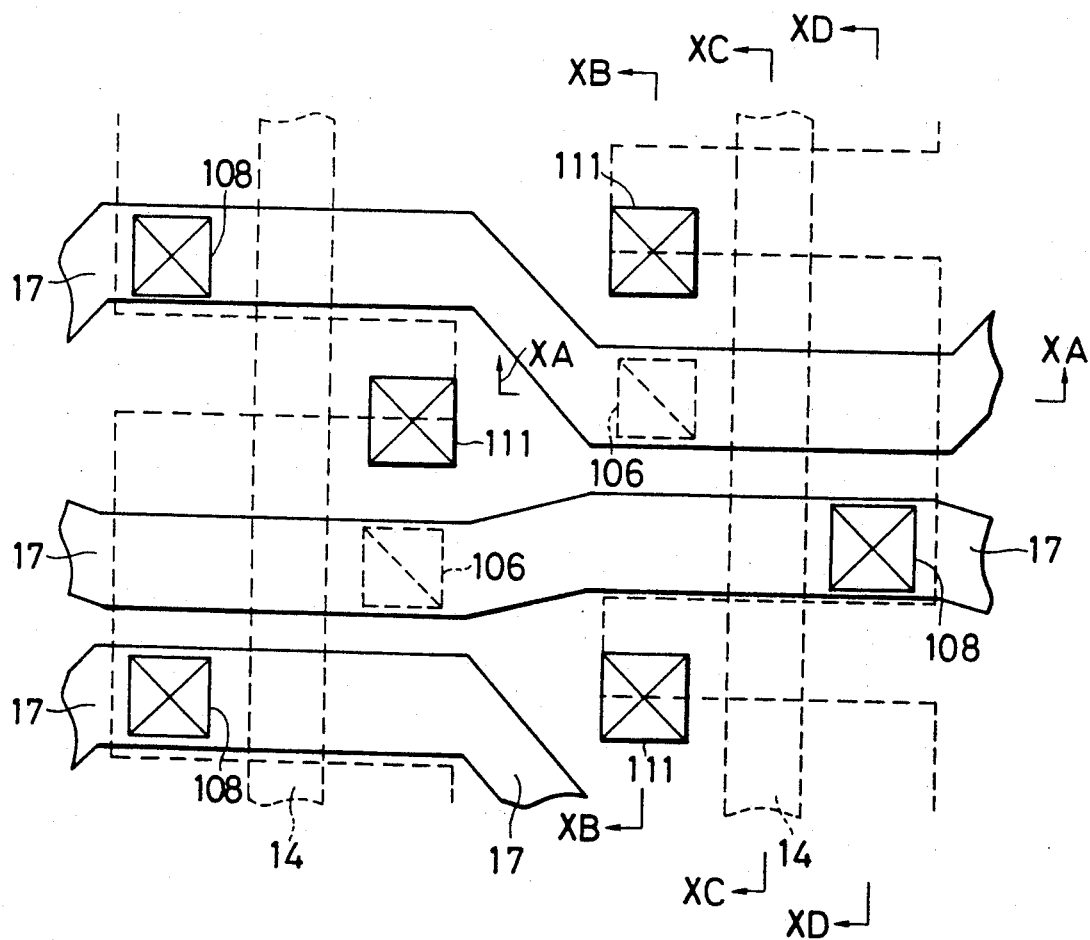

Formed over the second interlayer insulating film 16 are bit lines 17 extending horizontally as seen in FIG. 11E.

The bit lines 17 extend through the second interlayer insulating film 16 downward as seen in FIG. 10D, and are in contact, via contact 108 in a contact hole extending through the second interlayer insulating film 16, with the source contact region T1sx of the write transistor T1, as shown in FIG. 10D and FIG. 11E.

The bit lines 17 run so as to avoid the locations where the contact chips 111 are provided for connection of the $V_{DD}$ power supply layer 5 with the drains T2d of the storage transistor T2. This will permit the contact chips 111 and the bit lines 17 to be formed in the same process step.

The contact holes for contact between the bit lines 17 and the source contact regions T1sx of the write transistors T1 are aligned with the contact holes for contact between the source contact regions T1sx of the write transistors T1 and the source T2s of the storage transistors T2.

A method of producing memory devices with the gain cells of the above configuration will now be described with reference to FIG. 12A to FIG. 12H.

Figure 12A:
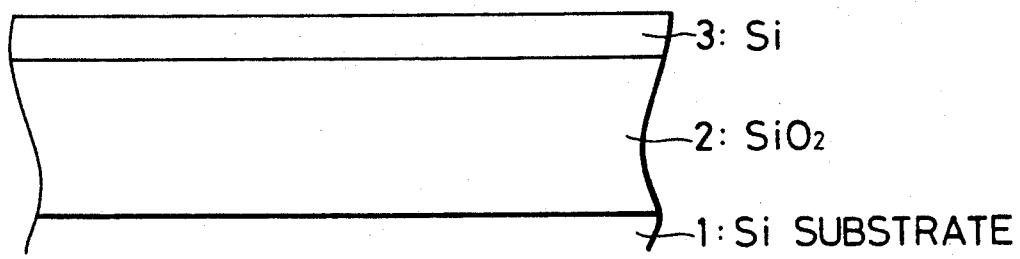
FIG. 12A to FIG. 12H are sectional views showing the process steps of fabrication of the gain cell shown in FIG. 8, FIG. 9, FIG. 10A to FIG. 10D and FIG. 11A to FIG. 11E.

First, an SIO (silicon on insulator) type Si wafer comprising an Si substrate 1 with an $SiO_2$ layer 2 and a p-type Si crystalline layer 3 is provided (FIG. 12A).

Figure 12B:
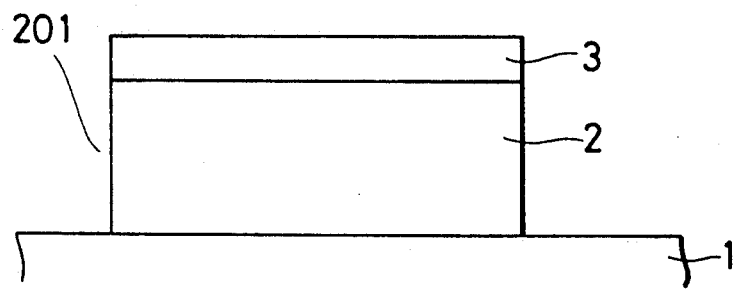

First trenches 201 are then formed in the surface of the SIO substrate, at the element isolation regions. The first trenches 201 are formed to reach the Si substrate 1 (FIG. 12B).

Figure 12C:
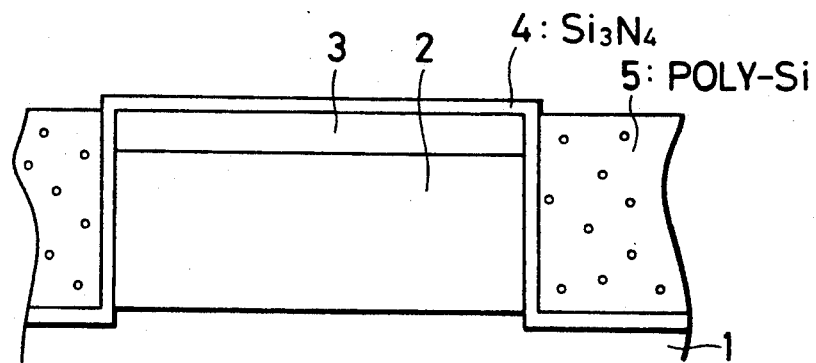

An $Si_3N_4$ film 4 is then formed unselectively, i.e., throughout the entire surface of the substrate by CVD, i.e., chemical vapor deposition (FIG. 12C).

The first trenches 201 are then filled with a low-resistance polysilicon layer 5 by CVD and etching-back (FIG. 12C).

Figure 12D:
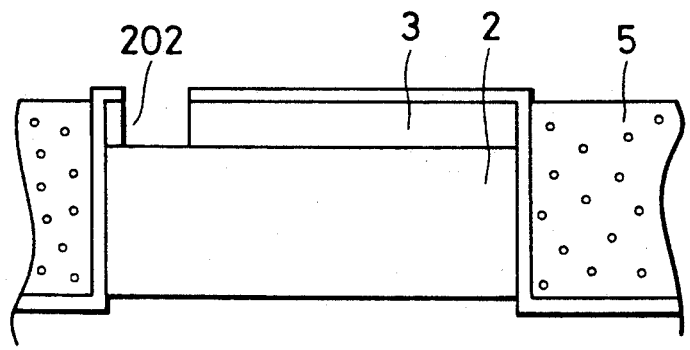

Second trenches 202 are next formed through the $Si_3N_4$ layer 4 and the Si layer 3, at the regions where the ridge parts 7c of the read word lines 7 will be formed (FIG. 12D). The second trenches 202 are formed to reach the $SiO_2$ layer 2.

Figure 12E:
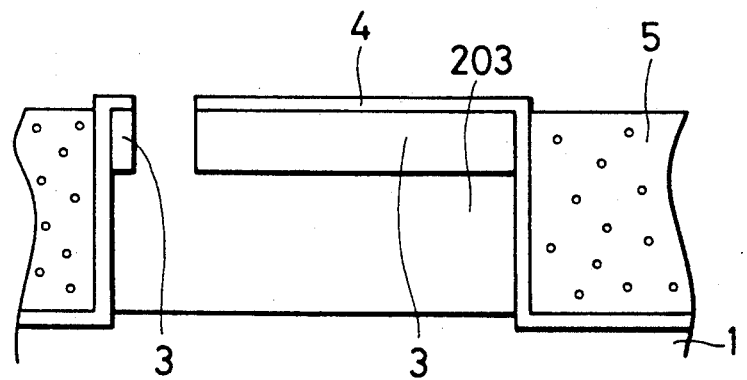

The $SiO_2$ layer 2 is thereafter removed by wet etching (FIG. 12E). By using hydrofluoric acid, the Si layer 3, the Si substrate 1 and the $Si_3N_4$ layer 4 are left unetched. As a result, a cavity 203 is formed where the $SiO_2$ layer 2 was present.

Figure 12F:
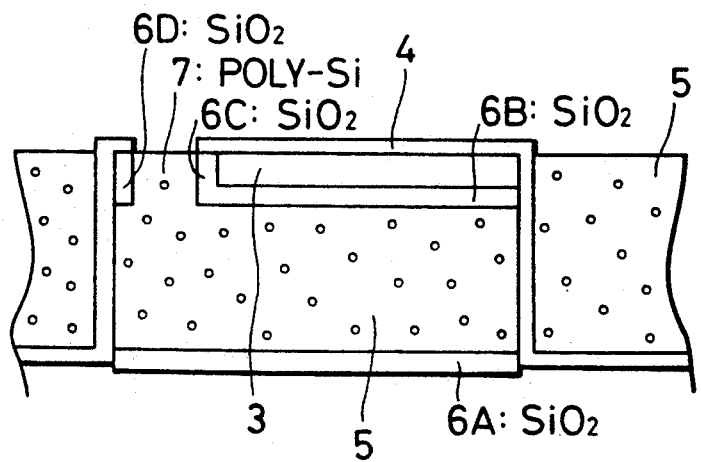
Figure 12:
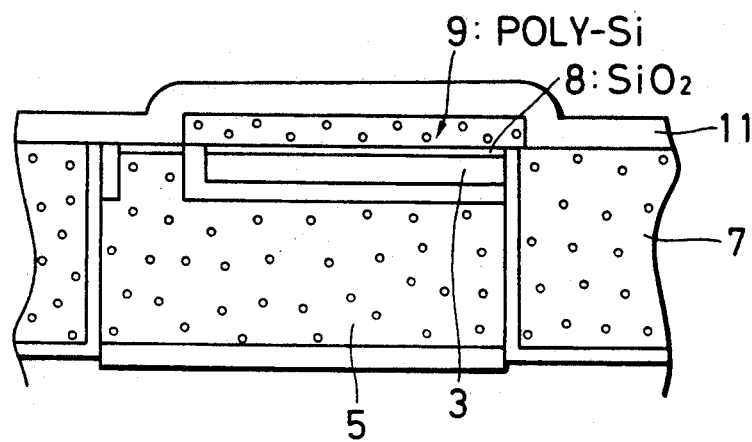
Figure 12:
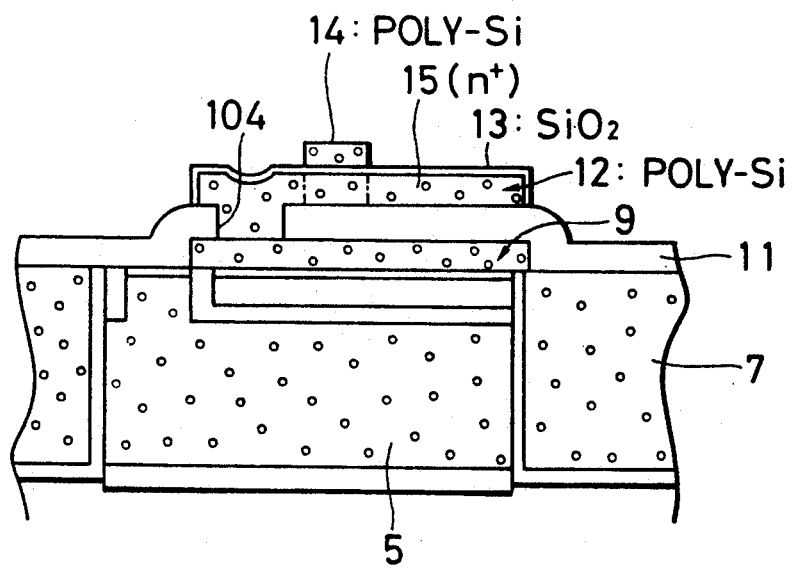

Thermal oxidation is then conducted to form SiO$_2$ films 6A, 6B, 6C and 6D on the exposed surfaces of the Si substrate 1 and the Si layer 3, i.e., the film 6A on the upwardly-facing surface of the Si substrate 1 and the film 6B on the downwardly-facing surface of the Si layer 3 and the films 6C and 6D on the side walls of the Si layer 3 (FIG. 12F). The SiO$_2$ film 6B on the downwardly-facing surface of the Si layer 3 will be a gate insulating layer for a biasing electrode of the storage transistor T2.

The cavity 203 is then filled with a low-resistance polysilicon layer 7 by LPCVD (low-pressure CVD) and etching-back (FIG. 12F).

Then, the Si$_3$N$_4$ film 4 on the Si layer 3 is removed, by hot phosphoric acid and a thin gate oxide film 8 is formed on the Si layer 3 (FIG. 12G).

A third polysilicon layer 9 is then formed throughout the entire surface of the substrate, and is then patterned as shown in FIG. 11C (FIG. 12G).

Then, using the polysilicon layer 9 as a mask, ions are implanted into the Si layer 3, at the regions which are not covered with the polysilicon layer 9, and which will be n+ diffusion source and drain regions T2s and T2d (FIG. 11G).

The first interlayer insulating film 11 is next formed (FIG. 12G).

A contact hole 104 over part of the polysilicon layer 9 and another contact hole 105 (not shown in FIG. 12H, but shown in FIG. 10D) is then formed through the first interlayer insulating film 11 (FIG. 12H).

A fourth polysilicon layer 12 is next formed by CVD and pattern-etched as shown in FIG. 11D (FIG. 12H). Since this fourth polysilicon layer 12 will be the device region of the write transistor T1, it must be p-type polysilicon.

A thermal oxidation is thereafter conducted to form an SiO$_2$ film 13 which will be a gate insulator of the write transistor T1 (FIG. 12H).

CVD and pattern-etching are thereafter conducted to form a fifth polysilicon layer 14 which serve as a gate T1g of the write transistor T1 and a write word line WL (FIG. 11).

Then, using the gate polysilicon layer 14 as a mask, ions are implanted in the fourth polysilicon layer 12 to form n+ regions which will be the source and drain regions T1s and T1d of the write transistor T1 (FIG. 12H).

After the structure shown in FIG. 12H is formed, the second interlayer insulating film 16 (FIG. 10A to FIG. 10D) is next formed. Contact holes 108 and 109 are then formed through the second interlayer insulating film 16. Finally, the bit lines 17 and V$_{DD}$ contact chips 111 are formed of aluminum (FIG. 10B and FIG. 10D).

Thus, the structure shown in FIG. 10A to FIG. 10D, and FIG. 11A to FIG. 11E is obtained.

In the embodiment described, the semiconductor memory device is formed basically of a silicon. The invention is applicable where semiconductor materials other than silicon is used to form the memory device. Where semiconductor materials other than silicon is used, polycrystalline semiconductor materials may be used for those parts which are formed of polysilicon in the embodiment described above.

According to the invention, the bit lines are shared for writing and reading, and the wiring conductors are formed in the element separation regions. The packing density of the memory elements can be increased significantly.

Moreover, the storage transistors are controlled by the substrate biasing effect via the insulator film, so the margins in the fabrication of the device can be enlarged.

What is claimed is:

1. A semiconductor memory element having a circuit configuration comprising:
    a bit line used for reading and writing;
    a write word line;
    a read word line;
    a power supply line;
    a first MOSFET having a source electrode, a drain electrode and a gate electrode;
    a second MOSFET having a channel region, a source electrode, drain electrode and a gate electrode;
    said source electrode of said first MOSFET and said source electrode of said second MOSFET being connected to said bit line;
    said drain electrode of said first MOSFET and said gate electrode of said second MOSFET being connected to each other to serve as a charge storage region;
    said gate electrode of said first MOSFET being connected to said write word line;
    said drain electrode of said second MOSFET being connected to said power supply line; and
    said channel region of said second MOSFET being capacitively coupled via an insulating layer with said read word line thereby to receive substrate biasing by capacitive coupling from the read word line.

2. A semiconductor memory device comprising:
    a plurality of bit lines used for reading and writing;
    a plurality of write word lines;
    a plurality of read word lines;
    a power supply line;
    a matrix of a plurality of gain cells, each connected to one of said bit lines, one of said write word lines, one of said read word lines and said power supply line;
    each gain cell comprising:
        a first MOSFET having a source electrode, a drain electrode and a gate electrode;
        a second MOSFET having a channel region, a source electrode, drain electrode and a gate electrode;
        said source electrode of said first MOSFET and said source electrode of said second MOSFET being connected to said one of the bit lines;
        said drain electrode of said first MOSFET and said gate electrode of said second MOSFET being connected to each other to serve as a charge storage region;
        said gate electrode of said first MOSFET being connected to said one of said write word lines;
        said drain electrode of said second MOSFET being connected to said power supply line; and
        said channel region of said second MOSFET being capacitively coupled via an insulating layer with said one of the read word lines, thereby to receive substrate biasing from said one of the read word lines;
    an access means for writing data in or reading data from a selected gain cell, and comprising:
        a write drive means for applying a first potential to the write word line to which the selected gain cell is connected
        a data applying means for applying, when said write drive means is applying said first potential, data potential depending on the data to be written, to the bit line to which the selected gain cell is connected, so that the potential on said charge storage region is either a first value or a second value depending on the data potential applied;

a read drive means for applying a potential to the read word line to which the selected gain cell is connected, so that the potential on said bit line is either a first value or a second value depending on the potential on said charge stored region.

3. The device of claim 2, further comprising a power supply means for maintaining the power supplying line at a predetermined potential.

4. The device of claim 2, wherein said write drive means applies a second potential to other write word lines when it applies the first potential to the write word line to which the selected gain cell is connected.

5. The device of claim 2, wherein said read drive means applies a second potential to other read word lines when it applies the potential to the read word line to which the selected gain cell is connected.

* * * * *